United States Patent
Sato et al.

(10) Patent No.: US 7,498,189 B2
(45) Date of Patent: Mar. 3, 2009

(54) METHOD OF PRODUCING A RADIATION DETECTOR WITH A POLYSILICON CONVERTING LAYER

(75) Inventors: Toshiyuki Sato, Kyoto (JP); Satoshi Tokuda, Kusatsu (JP)

(73) Assignee: Shimadzu Corporation, Kyoto-Shi, Kyoto (JP)

( * ) Notice: Subject to any disclaimer, the term of this patent is extended or adjusted under 35 U.S.C. 154(b) by 698 days.

(21) Appl. No.: 11/071,165

(22) Filed: Mar. 4, 2005

(65) Prior Publication Data

US 2005/0158906 A1 Jul. 21, 2005

Related U.S. Application Data

(63) Continuation of application No. 09/771,547, filed on Jan. 30, 2001.

(30) Foreign Application Priority Data

Apr. 28, 2000 (JP) .............................. 2000-130192

(51) Int. Cl.
*H01L 21/00* (2006.01)
(52) U.S. Cl. .............................. 438/97; 438/48; 438/57; 438/69; 438/73
(58) Field of Classification Search ................ 438/149, 438/151, 161, 162, 48, 56, 57, 69, 73, 97; 250/370.09
See application file for complete search history.

(56) References Cited

U.S. PATENT DOCUMENTS

| 4,271,423 | A  | * | 6/1981 | Kang .......................... 257/333 |
| 5,917,210 | A  | * | 6/1999 | Huang et al. ................. 257/292 |
| 6,043,142 | A  | * | 3/2000 | Nakajima et al. ........... 438/585 |
| 6,242,729 | B1 | * | 6/2001 | Izumi et al. ............... 250/208.1 |
| 6,262,408 | B1 | * | 7/2001 | Izumi et al. ............... 250/208.1 |
| 6,344,370 | B1 | * | 2/2002 | Izumi et al. .................... 438/97 |
| 6,392,217 | B1 | * | 5/2002 | Teranuma et al. ........ 250/208.1 |
| 6,403,965 | B1 | * | 6/2002 | Ikeda et al. ............ 250/370.09 |
| 6,784,949 | B1 | * | 8/2004 | Nagata et al. ................. 349/39 |
| 6,798,030 | B1 | * | 9/2004 | Izumi et al. ................. 257/428 |

FOREIGN PATENT DOCUMENTS

JP 05275301 A * 10/1993

* cited by examiner

*Primary Examiner*—Matthew Smith
*Assistant Examiner*—Joseph C Nicely
(74) *Attorney, Agent, or Firm*—Manabu Kanesaka

(57) ABSTRACT

In a method of producing a radiation detector, an active matrix board is formed to include gate lines and data lines arranged in a two-dimensional lattice shape, a plurality of high-speed switching elements provided to respective lattice points and connected to the gate lines and the data lines, picture element electrodes connected to source electrodes of the high-speed switching elements, and charge storage capacitances disposed between the picture element electrodes and ground on a insulating base plate. Then, a converting layer is formed at upper portions of the respective picture element electrodes at a temperature between 300° C. and 800° C. to generate a pair of electron-hole by absorbing light or radiation. The active matrix board is formed of a poly-silicon process board.

5 Claims, 5 Drawing Sheets

METHOD OF PRODUCING A RADIATION DETECTOR WITH A POLYSILICON CONVERTING LAYER

CROSS REFERENCE TO RELATED APPLICATION

This is a continuation application of a patent application Ser. No. 09/771,547 filed on Jan. 30, 2001.

BACKGROUND OF THE INVENTION AND RELATED ART STATEMENT

The invention relates to a method of producing a radiation detector for an industry and a medical purpose, more particularly, a direct-converting-type radiation detector using a converting layer for absorbing light or radiation to generate a pair of electron-hole.

Heretofore, there has been known a two-dimensional radiation image detector, wherein semiconductor sensors (light or radiation detecting elements) sensitive to X-rays to generate charge (electron-hole) are disposed two-dimensionally, and electric switches are provided thereto, respectively. Thus, the electric switches on the respective columns are consecutively turned on and charges of the sensors of the respective rows are read out.

FIG. 3 is a front view showing a structure of a conventional two-dimensional radiation image detector. FIG. 2 is a sectional view showing a structure of one picture element. The conventional two-dimensional radiation image detector includes an active matrix board 10 with a glass supporting base plate 11; a converting layer 1 of a light conductive layer formed almost all over the surface of the active matrix board 10; and a common electrode 1b disposed on an upper portion thereon. The active matrix board 10 includes electrode wirings in a matrix form formed of gate lines 4 and data lines 5 formed on an upper portion thereof with a layer insulating film 2b therebetween, switching elements 3 formed of thin film transistors (TFT), charge storage capacitances (Cs) 2 disposed between a capacitance electrode 2a and grounded electrode 2c, respectively, and pixel electrodes 1a connected to the capacitance electrodes 2a, respectively, provided on upper portions thereof.

As the converting layer 1 constituting a light conductive layer, a semiconductor material for generating a charge (electron-hole) when radiations, such as X-rays, are irradiated, is used. More specifically, amorphous selenium (a-Se) having a high dark resistance, a wide dynamic range with respect to X-ray irradiation, a good signal to noise (S/N) ratio and a good light conductive characteristic is used. The converting layer 1 as the light conductive layer (a-Se) is formed on a glass or quartz base plate, on which the active matrix driving circuit is provided, in a thickness of 300 to 1,000 μm by a vacuum deposition method at a temperature lower than 250° C. Also, since it is possible to lower a cost for a large converting layer 1, a thin film transistor film of hydrogenation amorphous silicone (a-Si:H) containing hydrogen is used as the semiconductor film for the active matrix driving circuit.

As described above, the active matrix board is structured by the thin film transistors (TFT) formed of the amorphous silicone (a-Si:H), X-Y matrix electrodes and charge storage capacitances (Cs), so that the active matrix board has the same structure as that of the active matrix board to be used for an active matrix type liquid-crystal display device (AMLCD). Thus, it is easy to use the active matrix board (AMLCD) as the active matrix board 10 for a two-dimensional radiation detector by slightly modifying its design.

Next, an operation and theory of the two-dimensional radiation picture image detector having the above structure are explained. When radiations are irradiated to the converting layer 1, such as amorphous selenium (a-Se) film, a charge (electron-hole) is generated in the converting layer 1. Since the converting layer 1 and the charge storage capacitance (Cs) 2 are electrically connected in series, when a voltage is applied between the common electrode 1b on an upper part and the capacitance electrode 2a, the charges (electron-hole) generated at the converting layer 1 are moved to a plus electrode side and a minus electrode side, respectively, so that the charges are stored in the charge storage capacitance (Cs) 2.

According to the above operation, when an input signal of a gate line 4 from a gate driving circuit 6 provided to an outer portion is inputted to a thin film transistor (TFT) gate, the thin film transistor (TFT) opens. Then, the charges stored in the charge storage capacitance (Cs) 2 are taken out from the source to the drain, and then taken out to a signal reading circuit 7 provided on an outer portion through the data line 5. Since the electrode wirings of the gate lines 4 and data lines 5, the thin film transistors (TFT) of the switching elements 3 and the charge storage capacitances (Cs) 2 are disposed in the X-Y matrix form, picture image information of the X-ray can be obtained two-dimensionally through the data lines 5 by sequentially scanning the signals inputted into the thin film transistors (TFT) gate electrodes from the gate lines 4.

Incidentally, the above-described two-dimensional radiation image detector can also be used as a two-dimensional image detector of a visible light and infrared light, in case the converting layer 1 to be used has a light conductivity with respect to not only radiations, such as X-ray, but also the visible light and infrared light.

The conventional two-dimensional radiation image detector is structured as described above, wherein the amorphous selenium (a-Se) as the converting layer 1 is directly formed on the active matrix board 10 by a vapor deposition method. In this structure, there are following problems.

(1) In case semiconductor materials other than amorphous selenium (a-Se) as the converting layer 1 are used, semiconductor materials to be used are restricted due to a heat resistance problem of the active matrix board 10. For example, in case a polycrystalline film of CdTe or CdZnTe having a more improved sensitivity with respect to X-ray when compared with amorphous selenium is formed by a MOCVD method, proximity sublimation method, paste baking method or the like, which is suitable for forming a large area film, a film forming temperature higher than 300° C. is required. However, generally, a heat resistant temperature of the switching element (TFT) 3 formed on the active matrix board 10 is about 250° C., in case the amorphous silicone (a-Si:H) is used as a normal semiconductor layer. Therefore, there is a difficulty in directly forming a polycrystalline film of CdTe and CdZnTe on the active matrix board 10 of a-Si:H.

(2) In a large two-dimensional picture image detector, wirings of the gate lines 4 and data lines 5 in the active matrix board 10 become long, and the gate lines 4 and the data lines 5 are connected to the gate driving circuit 6 and signal reading-out circuit 7 through flexible panel circuits (FPC) by using anisotropic conductive films (ACF) and the like. In this case, there is a problem such that noises are generated by these parasitic resistance and capacitance component to thereby deteriorate a signal to noise (S/N) ratio and a dynamic range as important performances of the two-dimensional picture image detector.

The present invention has been made to solve these problems, and an object of the invention is to provide a method of producing a radiation detector, wherein a high thermal resistant matrix process board is used so that polycrystalline film of CdTe, CdZnTe and the like can be directly formed thereon, to thereby provide a low signal to noise (S/N) ratio and prevent reduction of a dynamic range caused by connection of circuits.

Further objects and advantages of the invention will be apparent from the following description of the invention.

SUMMARY OF THE INVENTION

In order to attain the above objects, according to a first aspect of the invention, a radiation detector of the present invention is formed, which comprises an active matrix board including gate lines and data lines arrayed in a two-dimensional lattice shape and formed on insulating plate, a plurality of high-speed switching elements provided at respective lattice points and connected to the gate lines and the data lines, picture element electrodes connected to source electrodes of the high-speed switching elements, and charge storage capacitances, each being disposed between the capacity electrode and the ground; and a converting layer formed on upper parts of the picture element electrodes to generate a pair of electron-hole by absorbing lights or radiations, wherein a poly-silicone (Poly-Si) process board is used as the active matrix board.

According to a second aspect of the present invention, the converting layer for generating the pair of electron-hole by absorbing the light or radiation is a polycrystalline film of CdTe or CdZnTe.

The radiation detector of the present invention is structured as described above, wherein since the active matrix board is formed of a poly-silicone (Poly-Si) process board, the polycrystalline converting layer can be formed at a film-forming temperature higher than 300° C. Therefore, a two-dimensional picture image detector can be structured by using a variety of polycrystalline semiconductor films, such as CdTe and CdZnTe having a high sensitivity with respect to light and radiation, as a converting layer.

Also, since the active matrix board is formed of a poly-silicone process board, signal process circuits, such as a gate driving circuit, a signal reading-out circuit formed of a pre-amplifier and the like can be provided on a large active matrix board to thereby obtain a two-dimensional radiation picture image detector having a low noise and a large dynamic range.

DETAILED DESCRIPTION OF PREFERRED EMBODIMENTS

Figure 1:
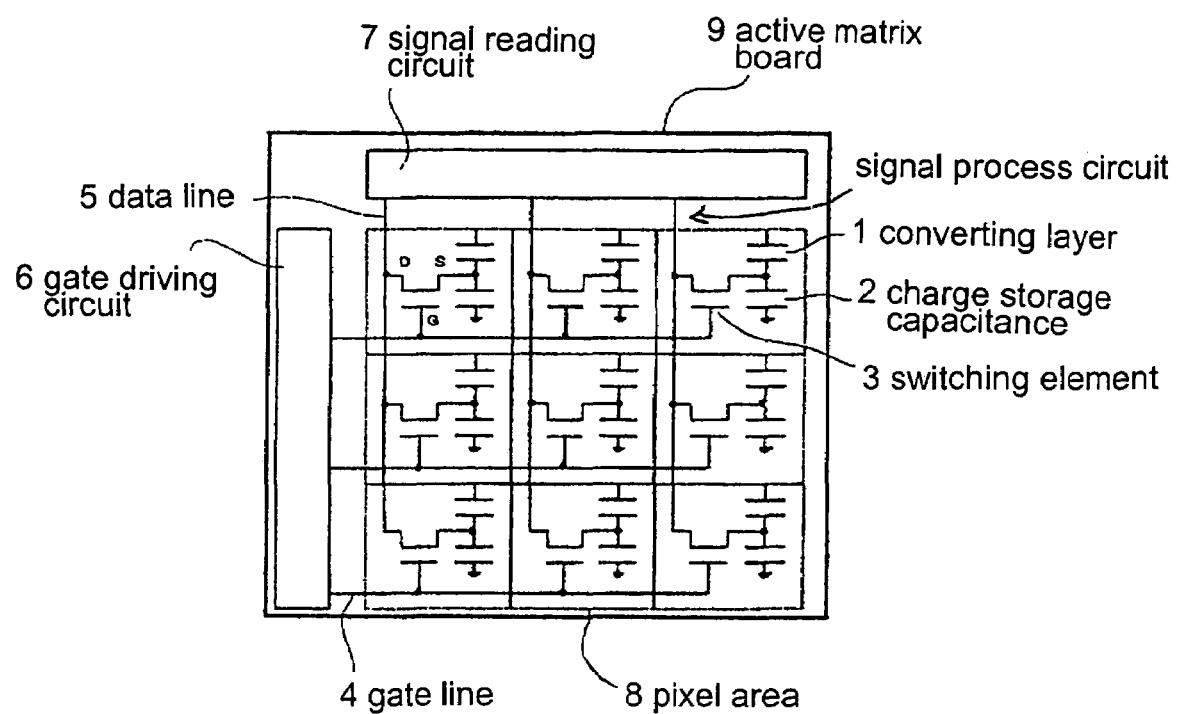
FIG. 1 is a front view showing a circuit structure of a radiation detector according to the invention.
Figure 2:
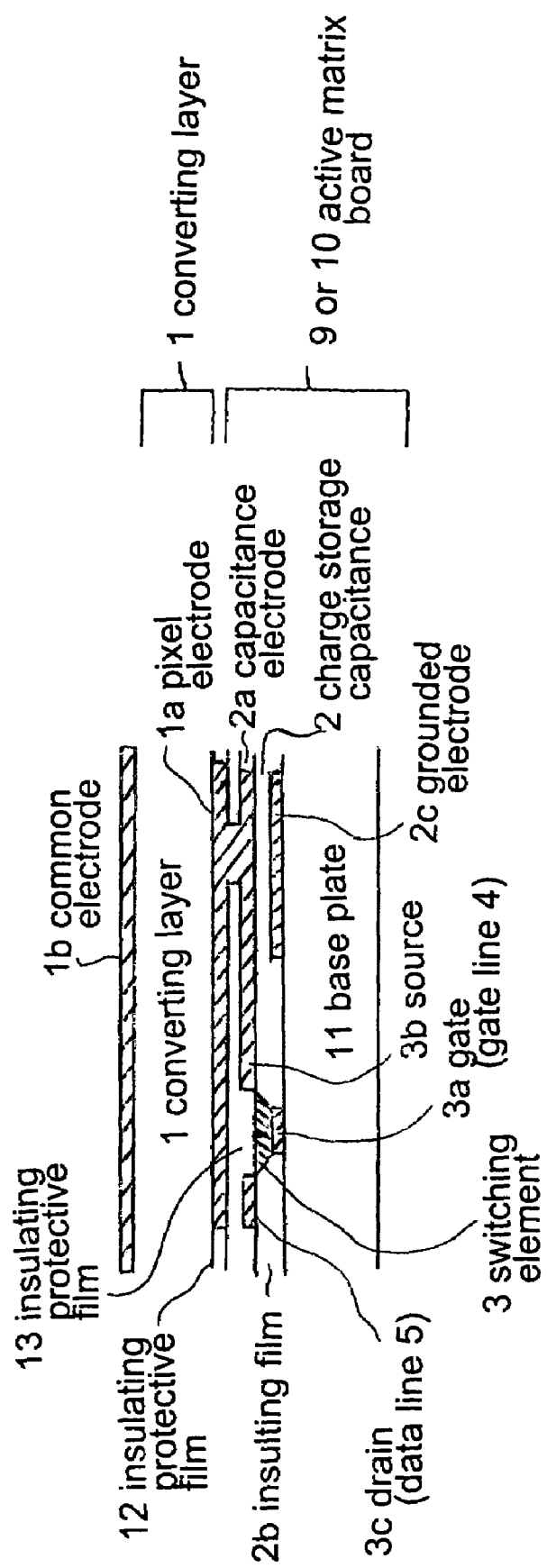
FIG. 2 is a sectional view of the radiation detector for explaining a manufacturing method of the radiation detector of the invention and the conventional circuit.
Figure 3:
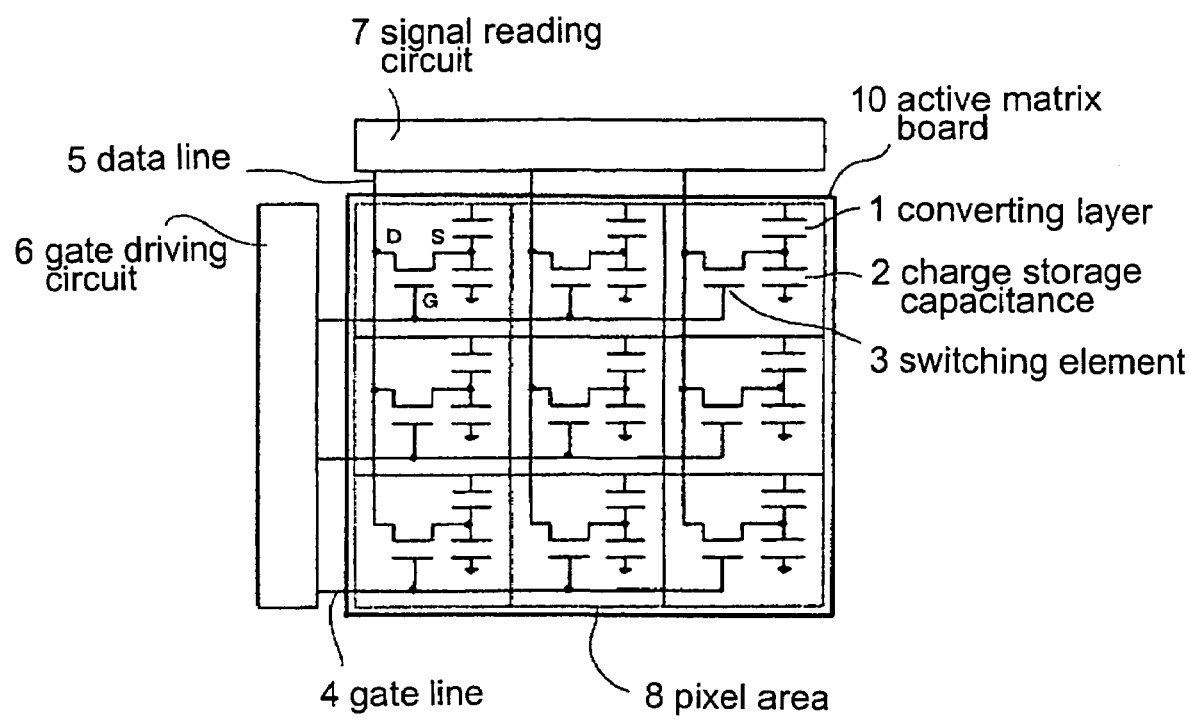
FIG. 3 is a front view showing a circuit structure of a conventional radiation detector.

A radiation detector of an embodiment according to the present invention is explained with reference to FIGS. 1 and 2. FIG. 1 is a front view of a radiation detector according to the invention, and FIG. 2 is a sectional view of a picture element of the radiation detector.

A radiation detector of the present invention comprises an active matrix board 9, a converting layer 1, a common electrode 1b provided on an upper portion of the converting layer 1, a gate driving circuit 6, and a signal reading-out circuit 7, both being disposed outside a pixel region 8 of the active matrix board 9. The active matrix board 9 includes a high thermal resistance insulating supporting base plate 11, gate lines 4 and data lines 5 arrayed in a two-dimensional lattice shape on the supporting base plate 11, high-speed switching elements 3 formed of a plurality of polycrystalline silicone thin film transistors (Poly-Si TFT) provided to respective lattice points and connected to the gate lines 4 and the data lines 5, pixel electrodes 1a connected to electrodes of sources 3b of the high-speed switching elements 3, respectively, capacitance electrodes 2a connected to the pixel electrodes 1a, respectively, and charge storage capacitances 2, each being disposed between the capacitance electrode 2a and grounded electrode 2c. The converting layer 1 is formed at upper portions of the respective pixel electrodes 1a to generate a pair of electron-hole by absorbing light or radiation.

The active matrix board 9 is structured such that, first, the gate lines 4 to be connected to the gates 3a of the thin film transistor (TFT) elements, the ground electrodes 2c and layer insulating film 2b provided thereon are formed on the high thermal resistant insulating supporting base plate 11. Then, semiconductor layers for the switching elements 3 formed of the polycrystalline silicon thin film transistors (Poly-Si TFT) are formed at the positions of the gates 3a. Thereafter, each data line 5 is disposed in a drain 3c of the thin film transistor (TFT) element to form the capacitance electrode 2a to the source 3b of the thin film transistor (TFT) element. Thus, the charge storage capacitance 2 is formed between the ground electrode 2 and capacitance electrode 2a. Then, the pixel electrode 1a connected to the capacitance electrode 2a is formed on an upper portion of each pixel through an insulation protective film 13.

In the conventional radiation detector, a thin film transistor (TFT) base plate formed of amorphous silicone (a-Si) is used. However, the radiation detector of the invention is produced by using a thin film transistor (TFT) base plate formed of the polycrystallin silicon (Poly-Si). The reason for using the polycrystallin silicon is that the polycrystalline silicon thin film transistor (Poly-Si TFT) base plate has a heat resistant temperature higher than that of the amorphous silicon thin film transistor (a-Si TFT) base plate, so that it is stable even at an environmental temperature higher than 300° C.

Figure 4:
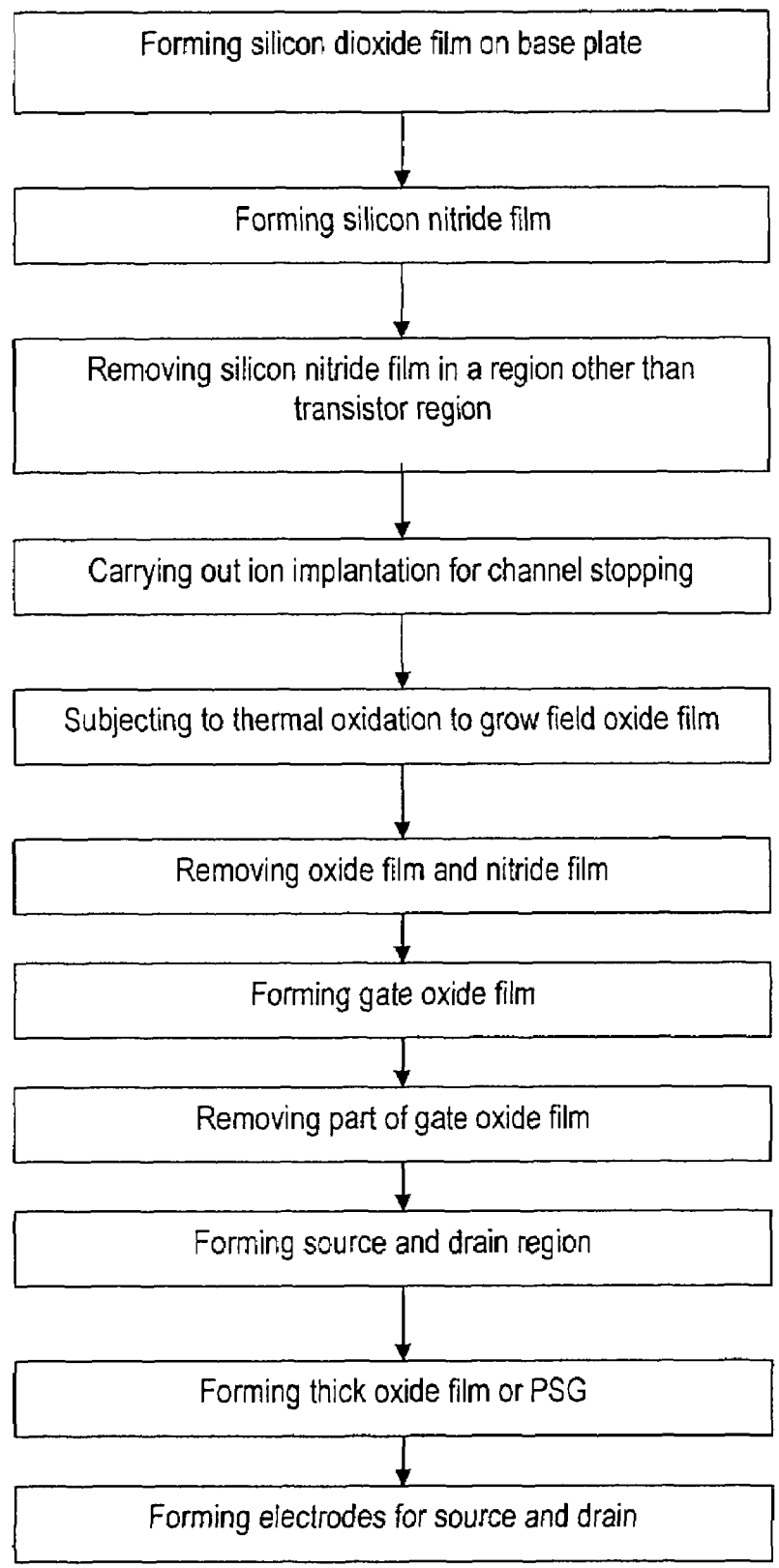
FIG. 4 is a flow chart forming an active matrix board.

Next, a production process of an Si gate nMOS of the polycrystalline silicon thin film transistor (Poly-Si TFT) is explained with reference to FIG. 4. First, a thin silicon dioxide film is formed on a base plate surface at an initial step and a silicon nitride film is further formed thereon. Then, the silicon nitride film in a region other than the transistor region on the base plate surface is removed, and an ion implantation for a channel stopping is carried out, which is then subject to a thermal oxidation to grow a field oxide film thicker than 500 nm on the portion where the silicon nitride film is removed. At this time, a half of the thick oxide film is implanted into the base plate. Next, the oxide film and nitride film are removed, and again, a thin gate oxide film of the order of 20 to 40 nm is formed or grown. The thin oxide film is removed with poly-crystalline silicon as a mask, and $n^+$ ion is applied thereon to form the source and drain regions. Next, a thick oxide film or PSG is formed by a chemical vapor deposition (CVD) method, a hole for a contact hole is made, an aluminum film is formed thereon by a sputtering method, and electrodes for the source and drain are formed by patterning.

In the radiation detector of the invention, the active matrix board 9 is produced in the same process as that of a poly-silicon (Poly-Si) active matrix board formed in a process for manufacturing a liquid-crystal display device. An entire area of a two-dimensional picture image detector is about 50 cm×50 cm, pixels are arranged in a matrix shape with a pitch of 150 μm. Further, a gate driving circuit 6 for sending signal to the gates 3a of the thin film transistor elements (switching elements 3 of p-Si) formed on the active matrix board 9, and signal reading circuit 7 including a pre-amplifier circuit for taking therein charge signals of the charge storage capacitances 2 from the converting layer 1 and the like are provided in circumferential portions of the active matrix board 9.

Figure 5:
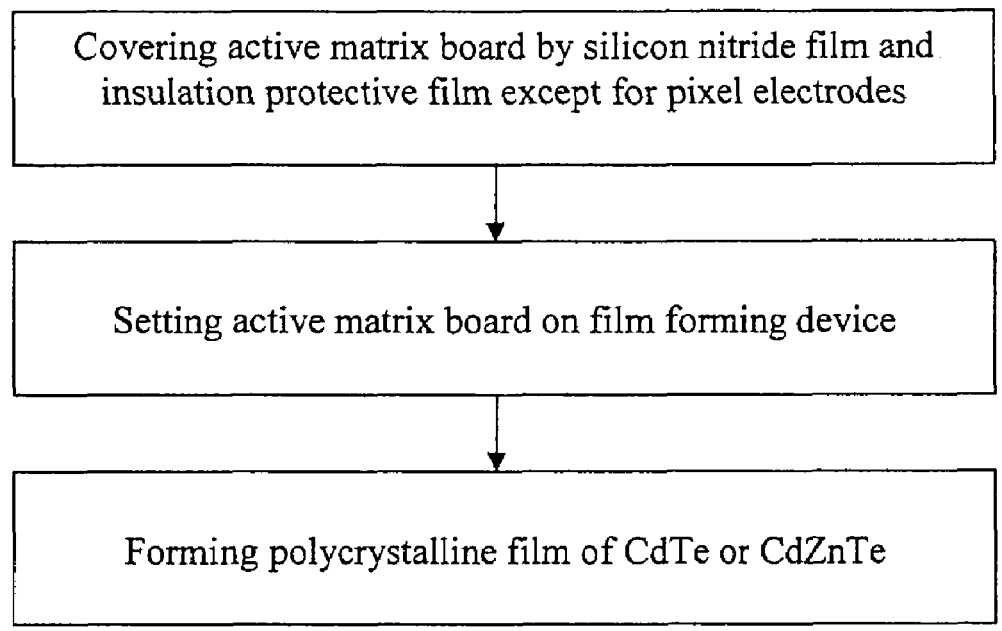
FIG. 5 is a flow chart forming a converting layer on the active matrix board.

Also, as shown in FIG. 5, the surface of the poly-silicon (poly-Si) active matrix board 9 is covered by the silicon nitride (SiN) film and an insulation protective film 12 of an organic-series resin except for the pixel electrodes 1a corresponding to the pixels. Then, after portions where the films are not required in the circumferential portion and the like are masked, and the active matrix board 9 is set on a film forming device. A polycrystalline film of CdTe, CdZnTe or the like for the converting layer 1 is formed by an MOCVD method, a closed spaced sublimation method, a paste baking method or the like, which are suitable for forming a film for a wide area. If necessary, a charge blocking layer of CdS, ZnTe or the like may be provided on and under the converting layer 1. Thereafter, on an upper portion of the converting layer 1, there is formed the common electrode 1b for transferring a charge (electron-hole) generated at the converting layer 1 to a plus electrode side and minus electrode side, and applying a bias voltage to collect to the charge storage capacitance (Cs) 2. Further, if necessary, a surface protective film may be formed.

In the radiation detector according to the present invention, since the switching element 3 formed of the poly-crystalline silicon (poly-Si) is formed on the active matrix board 9, the semiconductor films, such as CdTe and CdZnTe, of the converting layer 1 can be formed under a film forming condition of a temperature higher than 300° C. because the heat resistant temperature of the present active matrix board 9 is high, while the heat resistant temperature is about 250° C. in the conventional amorphous silicone switching element.

Then, for the connection of the gate lines 4, data lines 5, common electrodes 1b and grounded electrodes 2c formed on the active matrix board 9 having a wide area, with the gate driving circuit 6 and the signal reading-out circuit 7 provided at the circumferential portion outside the active matrix board 9, a signal process circuit can be made simultaneously on the same active matrix board 9. Therefore, there are generated no noises caused by parasitic resistance and capacitance components through connection of FPC or the like to thereby obtain a two-dimensional radiation picture image detector having a low noise and a large dynamic range.

In the above embodiment, the radiation detector employing the active matrix board 9 produced by a poly-silicone (Poly-Si) process is explained to be used for detecting light or radiation. However, the radiation detector can also be applied to the two-dimensional picture image detector of ultraviolet ray, infrared ray or the like.

Also, as materials for the semiconductor film to be used for the converting layer 1, CdTe and CdZnTe have been explained. However, materials necessary for obtaining desired detecting characteristics can be selected, if a film can be formed within a range of the thermal resistant temperature of the poly-silicon active matrix board.

The radiation detector according to the present invention is structured as described above and the active matrix board formed of the polycrystalline silicon thin film transistors (poly-Si TFT), insulating layers and electrodes produced by the poly-silicon (poly-Si) process is used, a stable polycrystalline converting layer can be obtained even at a film-forming temperature higher than 300° C. Thus, a variety of polycrystalline semiconductor films, such as CdTe and CdZnTe, having a high sensitivity with respect to light and radiation can be used to thereby obtain a radiation detector having a good signal to noise (S/N) ratio and a wide dynamic range.

Further, since the signal process circuits are formed simultaneously on the same active matrix board 9, there are generated no noises by the parasitic resistance and capacitance components through connection of FPC and the like to thereby obtain good picture images.

The disclosure of Japanese Patent Application No. 2000-130192, filed on Nov. 28, 2000, is incorporated in the application.

While the invention has been explained with reference to the specific embodiments of the invention, the explanation is illustrative and the invention is limited only by the appended claims.

What is claimed is:

1. A method of producing a radiation detector comprising:
forming an active matrix board including gate lines and data lines arrayed in a two-dimensional lattice shape, a plurality of high-speed switching elements provided at respective lattice points and connected to the gate lines and the data lines, each switching element being formed of polycrystalline silicon thin film transistor and having a source electrode, pixel electrodes connected to the source electrodes of the high-speed switching elements, and charge storage capacitances, each being disposed between the pixel electrode and a ground electrode, and
forming a converting layer on the pixel electrodes at a temperature between 300° C. and 800° C. to generate a pair of electron-hole by absorbing light or radiation.

2. A method according to claim 1, wherein said converting layer is a polycrystalline film formed of CdTe or CdZnTe.

3. A method according to claim 2, wherein said polycrystalline silicon thin film transistor has a heat resistance temperature more than 300° C.

4. A method according to claim 1, wherein the active matrix board is formed such that a silicon dioxide film is formed on a base plate surface; a silicon nitride film is further formed thereon; the silicon nitride film in a region other than a transistor region on the base plate surface is removed; an ion implantation for a channel stopping is carried out, which is then subject to a thermal oxidation to grow a field oxide film thicker than 500 nm on the region where the silicon nitride film is removed; the field oxide film and nitride film are removed; a gate oxide film of the order of 20 to 40 nm is formed; the gate oxide film is partly removed by a mask, and $n^+$ ion is applied after polycrystalline silicon has been formed and patterned on the gate oxide film to form the source and drain regions; a thick oxide film or PSG is formed; and electrodes for the source and drain are formed.

5. A method according to claim 4, wherein in forming the converting layer on the active matrix board, the active matrix board is covered by a silicon nitride film and an insulation protective film of an organic-series resin except for pixel electrodes; the active matrix board is set on a film forming device; and the polycrystalline film of CdTe or CdZnTe for the converting layer is formed.

* * * * *